United States Patent
Yu et al.

(10) Patent No.: US 9,704,714 B2
(45) Date of Patent: Jul. 11, 2017

(54) METHOD FOR CONTROLLING SURFACE CHARGE ON WAFER SURFACE IN SEMICONDUCTOR FABRICATION

(71) Applicant: Taiwan Semiconductor Manufacturing Co., Ltd, Hsin-Chu (TW)

(72) Inventors: Weibo Yu, Hsinchu (TW); Jui-Ping Chuang, Hsinchu (TW); Chen-Hsiang Lu, Hsinchu (TW); Shao-Yen Ku, Jhubei (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/688,191

(22) Filed: Apr. 16, 2015

(65) Prior Publication Data
US 2016/0307757 A1    Oct. 20, 2016

(51) Int. Cl.
*H01L 21/66* (2006.01)
*H01L 21/263* (2006.01)
*H05F 3/06* (2006.01)
*H05F 3/04* (2006.01)
*H01L 21/67* (2006.01)
*H01J 37/00* (2006.01)
*H01L 21/677* (2006.01)

(52) U.S. Cl.
CPC ...... *H01L 21/263* (2013.01); *H01L 21/67017* (2013.01); *H01L 21/67207* (2013.01); *H01L 22/14* (2013.01); *H05F 3/04* (2013.01); *H05F 3/06* (2013.01); *H01J 37/00* (2013.01); *H01L 21/67733* (2013.01); *H01L 21/67736* (2013.01)

(58) Field of Classification Search
CPC .......... H01L 21/67748; H01L 21/0201; H01L 21/02008
See application file for complete search history.

(56) References Cited

U.S. PATENT DOCUMENTS

| 4,693,777 | A | * | 9/1987 | Hazano | B25J 9/107 118/50 |
|---|---|---|---|---|---|
| 5,661,408 | A | * | 8/1997 | Kamieniecki | H01L 22/10 257/E21.529 |
| 2005/0074909 | A1 | * | 4/2005 | Steeples | H01J 37/304 438/17 |
| 2005/0095088 | A1 | * | 5/2005 | Kurita | B65G 49/064 414/217 |
| 2009/0294698 | A1 | * | 12/2009 | Ray | H01J 37/3171 250/492.21 |

* cited by examiner

*Primary Examiner* — Selim Ahmed
*Assistant Examiner* — Evan Clinton
(74) *Attorney, Agent, or Firm* — McClure, Qualey & Rodack, LLP

(57) ABSTRACT

A method for processing a semiconductor wafer is provided. The method includes performing a discharging process over the semiconductor wafer in a discharging chamber which is enclosed. The method further includes processing the semiconductor wafer by use of a first processing module after the discharging process. During the discharging process, charged particles applied on the semiconductor wafer are tuned based on the characteristics of the surface of the semiconductor wafer.

21 Claims, 9 Drawing Sheets

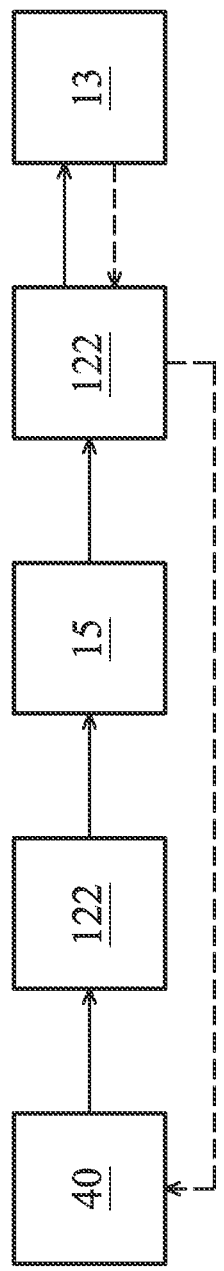
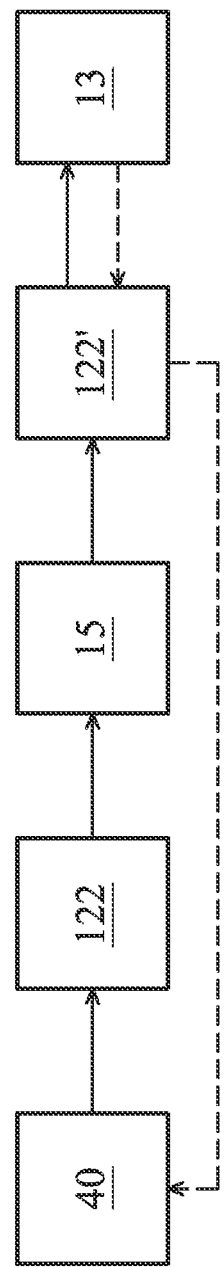

METHOD FOR CONTROLLING SURFACE CHARGE ON WAFER SURFACE IN SEMICONDUCTOR FABRICATION

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form an integrated circuit (IC) and elements thereon. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

During the manufacturing of the semiconductor devices, various processing steps are used to fabricate integrated circuits on a semiconductor wafer. One of the difficult factors in the continuing evolution toward smaller device size and higher density has been the ability to consistently form small critical dimensions within predetermined error windows. For example, semiconductor feature sizes are frequently subjected to optical or electrical metrology inspections following photolithographic patterning and etching to ensure that critical dimensions are within acceptable limits.

Although existing methods and devices for operating the processing steps have been generally adequate for their intended purposes, they have not been entirely satisfactory in all respects. Consequently, it would be desirable to provide a solution for the process control of semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5 shows a block diagram of stages of transferring semiconductor wafer in a first processing apparatus, in accordance with some embodiments.

FIG. 6 shows a block diagram of stages of transferring semiconductor wafer in a first processing apparatus, in accordance with some embodiments.

DETAILED DESCRIPTION

Figure 1:
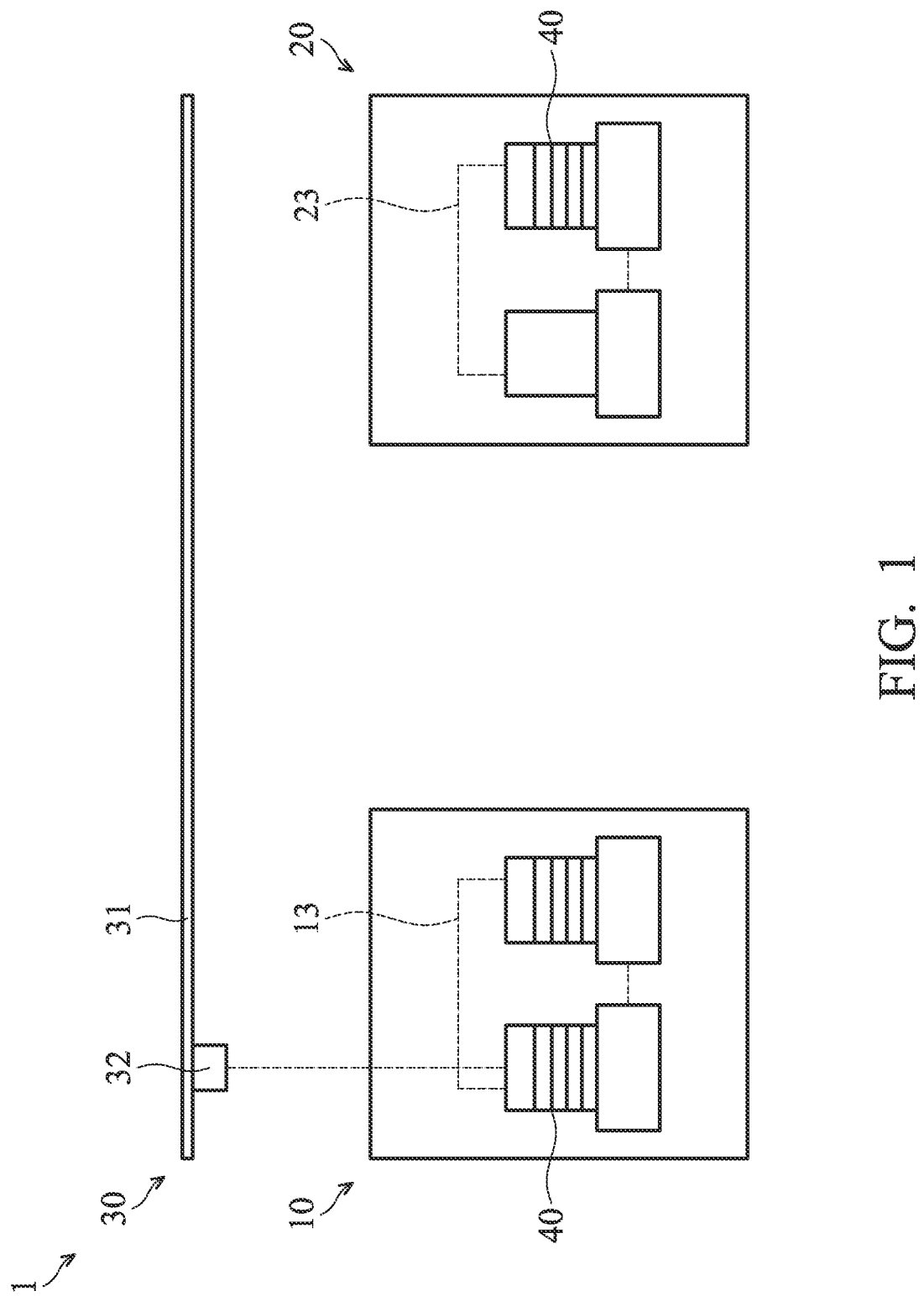
FIG. 1 shows a schematic view of a system for processing a semiconductor wafer in semiconductor manufacturing process, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIG. 1 is a schematic view of a system 1 for processing a semiconductor wafer 5 in semiconductor manufacturing process, in accordance with some embodiments. In some embodiments, the system 1 includes a first processing apparatus 10, a second processing apparatus 20, and a transporting apparatus 30. The elements of the system 1 can be added to or omitted, and the disclosure should not be limited by the embodiments.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

Figure 2:
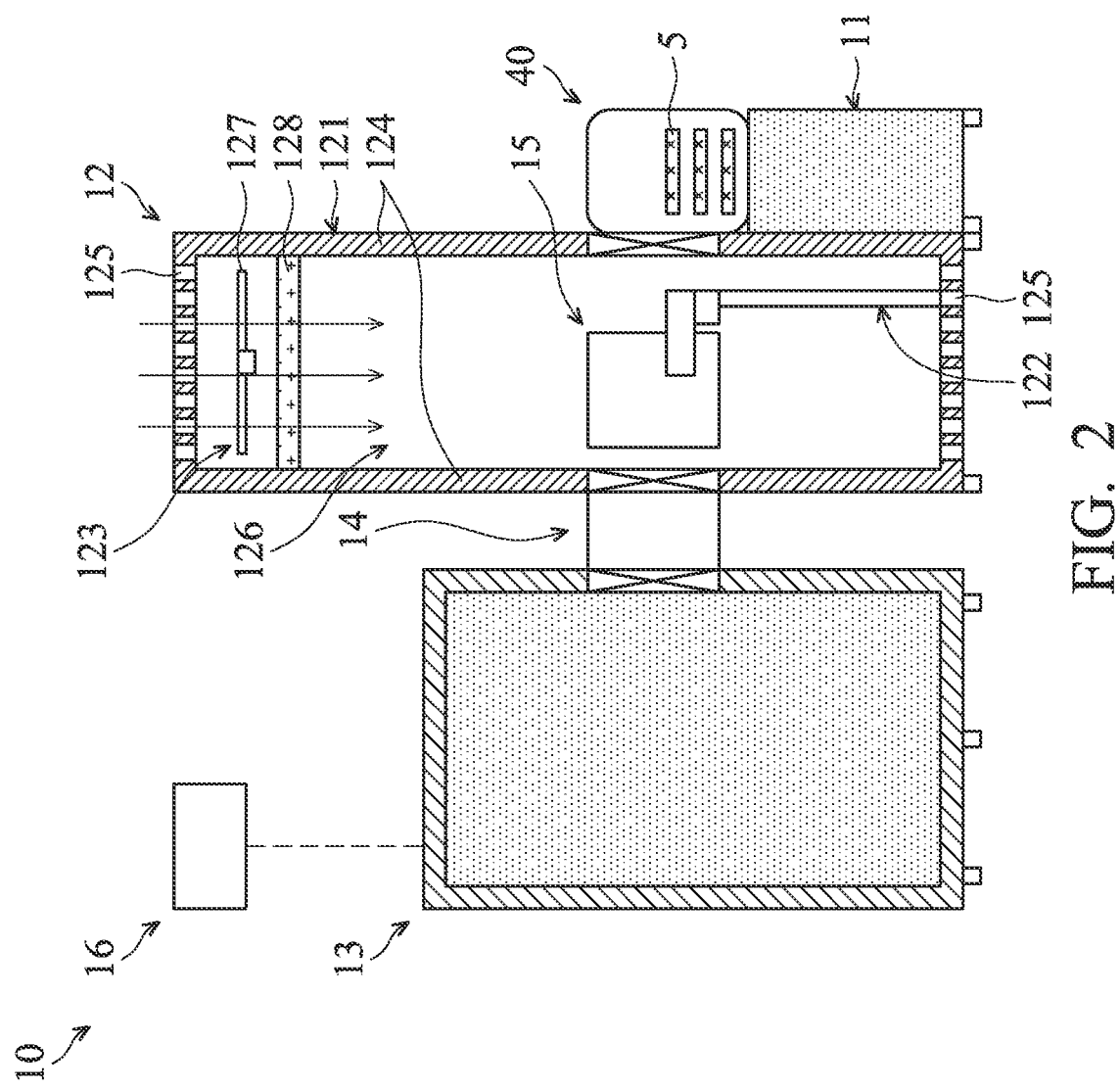
FIG. 2 shows a cross-sectional view of the first processing apparatus, in accordance with some embodiments.

FIG. 2 shows a cross-sectional view of the first processing apparatus 10, in accordance with some embodiments. In some embodiments, the first processing apparatus 10 includes a load port 11, an interface module 12, a first processing module 13, a load lock module 14, a discharging module 15, and a control module 16. The elements of the first processing apparatus 10 can be added to or omitted, and the disclosure should not be limited by the embodiments.

The load port 11 is adjacent to the interface module 12. In some embodiments, the transporting apparatus 30 (FIG. 1), such as an overhead hoist transport (OHT), transports a carrier 40, such as standard mechanical interface (SMIF) or front opening unified pod (FOUP) with one or more semiconductor wafers 5 from other apparatuses to the load port 11. When the carrier 40 is located on the load port 11, the semiconductor wafer 5 in the carrier 40 is transferred to the interface module 12.

The interface module 12 includes a housing 121, one or more transferring means such as robotic arm 122, and a fan filter assembly 123, in accordance with some embodiments. In some embodiments, the interface module 12 is a facility interface. In some embodiments, the interface module 12 includes an equipment front end module (EFEM).

The housing 121 includes a number of walls such as side walls 124, and two perforated plates 125, and a number of doors formed on the side walls 124 to allow the semiconductor wafer 5 to pass through. An interior 126 of the housing 121 is defined by the side walls 124 and two perforated plates 125. The two perforated plates 125 enable air communication between the ambient environment and the interior 126 of the housing 121.

The robotic arm 122 is disposed within the interior 126 of the housing 121. The robotic arm 122 is configured for physically transporting the semiconductor wafer 5. For example, the robotic arm 122 retrieves the semiconductor wafer 5 from a carrier 40 to the housing 121, or the robotic arm 122 transports the semiconductor wafer 5 to/from the load lock module 14. However, the locations where the robotic arm 122 transports semiconductor wafer 5 are not limited by the present embodiment. In some other embodiments, the interface module 12 includes multiple robotic arms 122, the robotic arms 122 transport a number of semiconductor wafers 5 to their respective carriers 40 and load lock modules 14.

The fan filter assembly 123 includes a fan 127 and a filter 128 and is mounted on the top of the housing 121. With the fan filter assembly 123, air flow is vented in the interior 126 of the housing 121 through the top perforated plate 125 and exhausted through the bottom perforated plate 125 to the ambient environment.

The first processing module 13 may be configured to perform any manufacturing procedure on the semiconductor wafer 5. In some embodiments, the first processing module 13 is configured to perform manufacturing procedures include deposition processes such as physical vapor deposition (PVD), chemical vapor deposition (CVD), plasma-enhanced chemical vapor deposition (PECVD) and/or other deposition processes. In some embodiments, the first processing module 13 is configured to perform manufacturing procedures that include etching processes such as wet and dry etching and ion beam milling. In some embodiments, the first processing module 13 is configured to perform manufacturing procedures including lithographic exposure, ion implantation, thermal processes, cleaning processes, testing, any procedure involved in the processing of the semiconductor wafer 5, and/or any combination of procedures.

In some embodiments, the first processing apparatus further includes a load lock module 14. The load lock module 14 is configured for preserving the atmosphere within the first processing module 13 by separating it from the interface module 300. The load lock module 14 is capable of creating an atmosphere compatible with the first processing module 13 or the interface module 12 depending on where the loaded semiconductor wafer 5 is scheduled to be next. This may require altering the gas content of the load lock module 14 by such mechanisms as adding gas or creating a vacuum, along with other suitable means for adjusting atmosphere in the load lock module 14. When the correct atmosphere has been reached, the corresponding door may be opened, and the semiconductor wafer 5 can be accessed.

Figure 3:
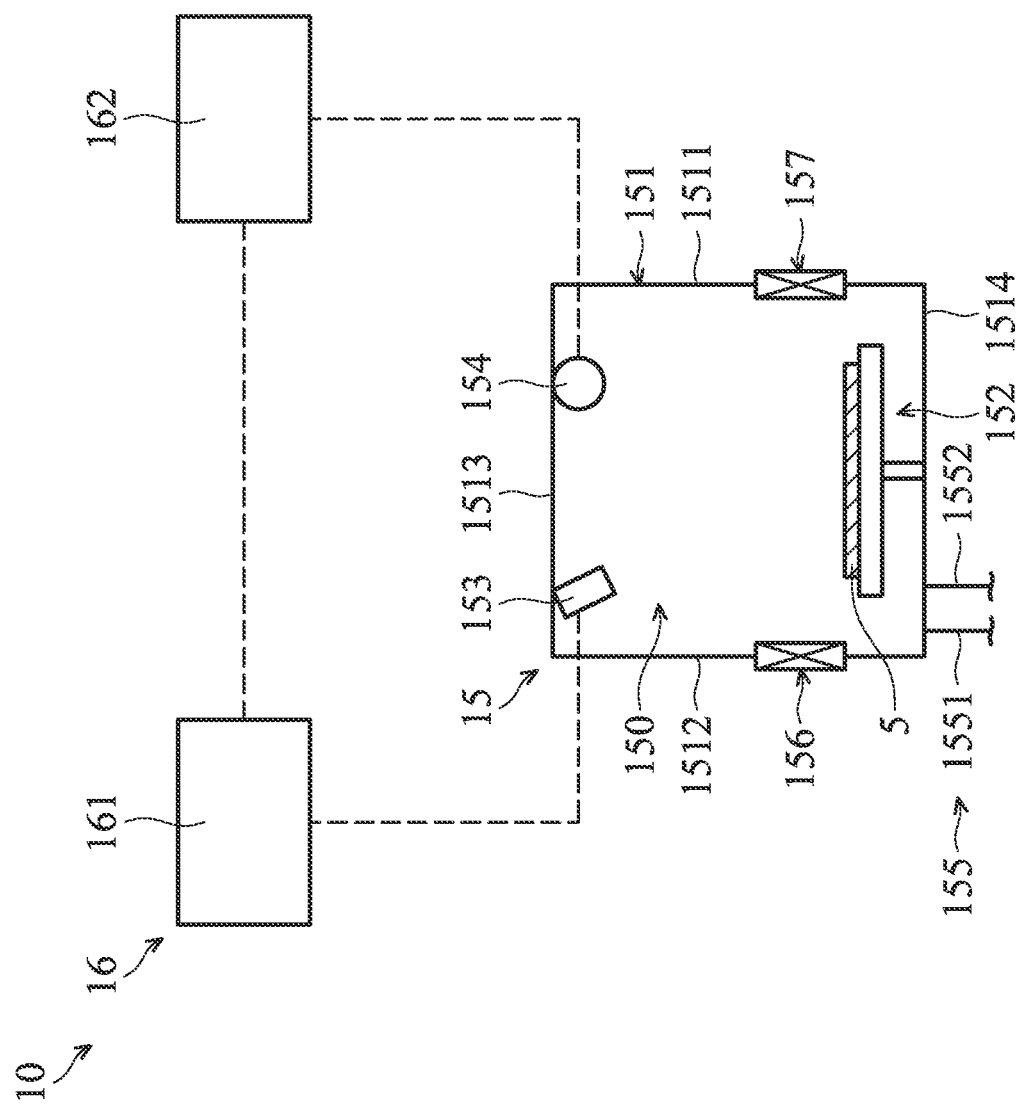
FIG. 3 shows a schematic view of partial elements of a first processing apparatus, in accordance with some embodiments.

FIG. 3 shows a schematic view of partial elements of the first processing apparatus 10, in accordance with some embodiments. In some embodiments, the discharging module 15 includes a discharging chamber 151, a wafer stage 152, a charge detection unit 153, an ion source unit 154, and a gas purging unit 157.

The discharging chamber 151 includes two doors 156 and 157 and a number of side panels such as two vertical side panels 1511 and 1512 and two horizontal side panels 1513 and 1514. The two vertical side panels 1511 and 1512 are arranged opposite to each other. The two horizontal side panels 1513 and 1514 are arranged opposite to each other. The side panels seclude the interior of the discharging chamber 151 from the interior 126 of the housing 121. The two doors 156 and 157 are respectively positioned on the two vertical side panels 1511 and 1512 for enabling the delivery of the semiconductor wafer 5.

In some embodiments, the interior 150 of the discharging chamber 151 communicates with the interior 126 of the housing 121 via the two doors 156 and 157. When both of the doors 156 and 157 are closed, an enclosed discharging chamber 151 is produced. An air environment held in the discharging chamber 151 is secluded from an air environment held in the interior 126 of the housing 121. However, it should be appreciated that many variations and modifications can be made to embodiments of the disclosure. For example, the door 157 positioned on the vertical side panel 1512 is omitted. The interior 150 of the discharging chamber 151 communicates with the interior 126 of the housing 121 via the door 156.

In some embodiments, the wafer stage 152 is disposed in the discharging chamber 151. The wafer stage 152 is configured for holding, positioning, moving, and otherwise manipulating the semiconductor wafer 5. The semiconductor wafer 5 may be secured on the wafer stage 152 by a clamping mechanism, such as vacuum clamping or e-chuck clamping.

The charge detection unit 153 is configured to detect at least one characteristic of a surface of the semiconductor wafer in the discharging chamber 151. In some embodiments, the charge detection unit 153 is disposed in the discharging chamber 151 relative to the wafer stage 152. In some embodiments, the charge detection unit 153 is used to detect the surface charge of a semiconductor wafer 5 as the semiconductor wafer 5 is positioned on the wafer stage 152. In some embodiments, the charge detection unit 153 includes Kelvin probe force microscopy (KPFM), also known as surface potential microscopy. The work function of the KPFM relates to many surface phenomena, including catalytic activity, reconstruction of surfaces, doping and band-bending of semiconductors, charge trapping in dielectrics, and corrosion.

The ion source unit 154 is configured to discharge charged particles over the semiconductor wafer 5 in the discharging chamber 151. In some embodiments, the ion source unit 154 is disposed in the discharging chamber 151 relative to the wafer stage 152. In some embodiments, the ion source unit 154 is used to produce positive ions, negative ions, or both positive ions and negative ions over the semiconductor wafer 5 as the semiconductor wafer 5 is positioned on the wafer stage 152. In some embodiments, the ion source unit 154 includes an ionizer bar having a predetermined length and extending parallel to the wafer stage 152. In some embodiments, a number of ion source units 154 are disposed in the discharging chamber 151. The ion source units 154 collectively operated so as to shower charged particles over predetermined regions of the semiconductor wafer 5.

The gas purging unit 155 is configured to purge gas into the discharging chamber 151. In some embodiments, the gas purging unit 155 includes a gas inlet 1551 and a gas outlet 1552. Gas is supplied into the discharging chamber 151 via the gas inlet 1551 and is exhausted from the discharging chamber 151 via the gas outlet 1552. It is appreciated that while the gas inlet 1551 and the gas outlet 1552 are connected to the side panel 1514 of the discharging chamber 151, the disclosure should not be limited thereto. The gas inlet 1551 and the gas outlet 1552 can be connected to any side panel of the discharging chamber 151.

In some embodiments, the gas inlet 1551 includes a gas cabinet, any other apparatus that is appropriate to provide the gas to the interior 150, and/or a combination thereof. Additionally, the gas inlet 1551 further includes a pump, a vacuum system, an engine, a motor, other apparatuses adequate to remove a gas from the interior 150, and/or a combination thereof.

In some embodiments, the discharging module 15 includes a number of discharging chambers 151. The discharging chambers 151 are disposed in different positions in the interface module 12. With multiple discharging chambers 151, the throughput of the first processing apparatus 10 is increased.

The control module 16 is configured to control the first processing apparatus 10. In some embodiments, the control module 16 includes a measurement control unit 161 and a discharge control unit 162.

The measurement control unit 161 is connected to the charge detection unit 153 and is used to control the charge detection unit 153. The detected data produced by the charge detection unit 153 is transmitted to the measurement control unit 161 and analyzed by the measurement control unit 161.

The discharge control unit 162 is connected to the ion source unit 154 and is used to control the ion source unit 154. The measurement result produced by the measurement control unit 161 is transmitted to the discharge control unit 162. The discharge control unit 162 outputs a signal to drive the ion source unit 154 according to measurement result.

In some embodiments, the second processing apparatus 20 includes the load port 11, the interface module 12, and the load lock module 14 as described in FIG. 2. In addition, the second processing apparatus 20 further includes a second processing module 23 connected to the load lock module 14. The second processing module 23 is configured to perform different process over the semiconductor wafer 5 from that performed by the first processing apparatus 10.

The transporting apparatus 30 is configured to transport or convey the carrier 40 to/from a stocker and/or the first and second processing apparatus 10 and 20. The transporting apparatus 30 includes a trail assembly 31, an overhead hoist transport (OHT) assembly 32, and a transporting controller, in accordance with some embodiments. The trail assembly 31 is mounted on the ceiling of a FAB, for example. The OHT assembly 32 is suspended by the trail assembly 31, and the transportation or the movement of the OHT assembly 32 on the trail assembly 31 is controlled by the transporting controller.

Figure 4:
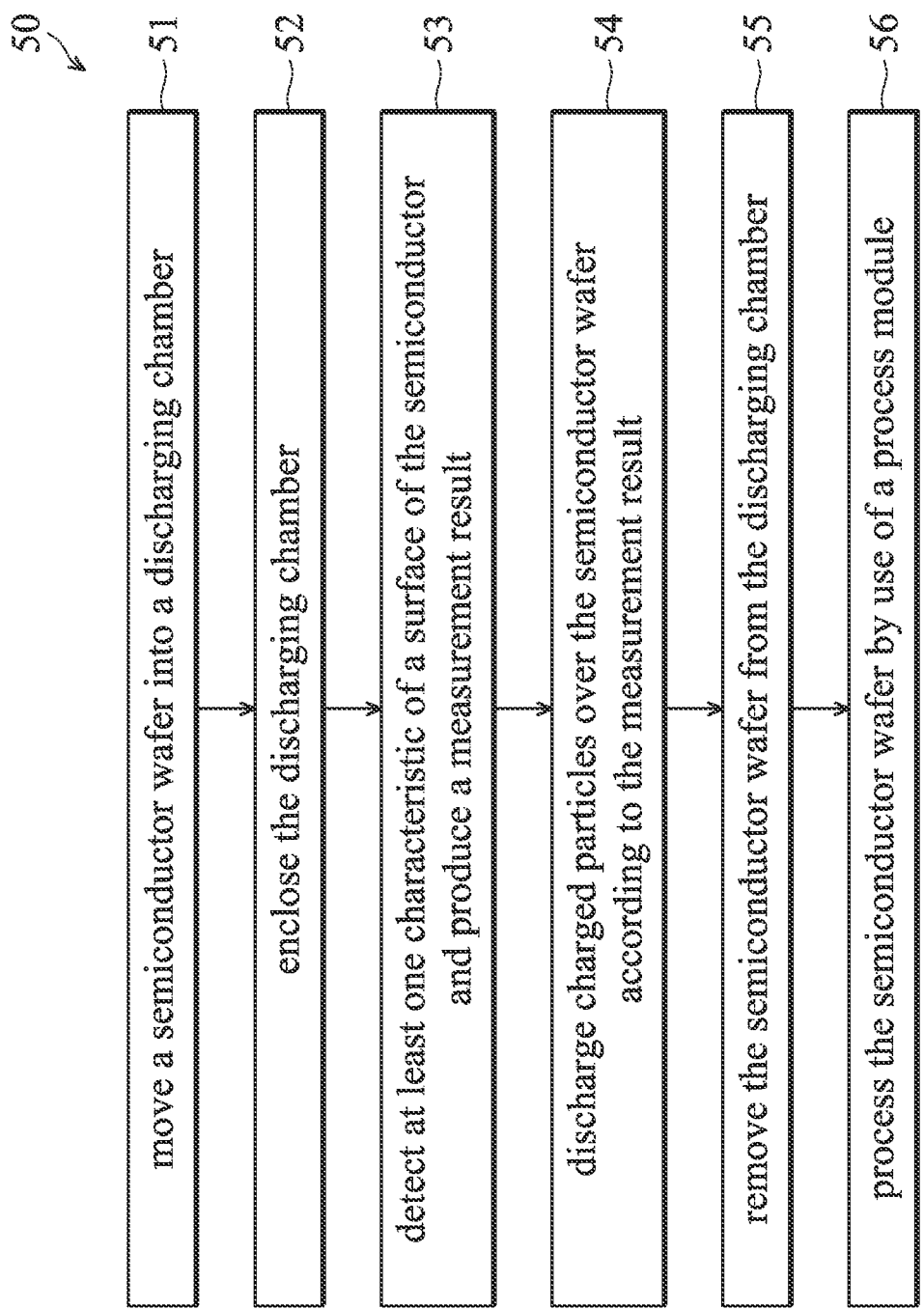
FIG. 4 shows a flow chart of methods for processing a semiconductor wafer, in accordance with some embodiments.

FIG. 4 is a flow chart illustrating a method 50 for processing a semiconductor wafer, in accordance with some embodiments. For illustration, the flow chart will be described along with the schematic views shown in FIGS. 1-3 and 5-6. Some of the stages described can be replaced or eliminated for different embodiments. Additional features can be added in the semiconductor device structure. Some of the features described below can be replaced or eliminated for different embodiments.

The method 50 begins with a discharging process in which a discharging process over a semiconductor wafer 5 is performed in a discharging module, such as discharging module 15 disposed in the interface module 12. In some embodiments, the discharging process includes the following operations.

The discharging process begins with operation 51, in which the semiconductor wafer 5 is moved into a discharging chamber 151 of the discharging module 15. In some embodiments, a number of semiconductor wafers 5 are contained in a carrier 40 and transferred to the first processing apparatus 10 via the transporting apparatus 30. After the carrier 40 is positioned on the load port 11, the door of the interface module 12 is opened. Afterwards, the semiconductor wafer 5 is transferred into the discharging module 15 disposed in the interior 126 of the housing 121 via the robotic arm 122.

As the semiconductor wafer 5 is approaching, one of the two doors, such as door 156, is opened. The interior 150 of the discharging chamber 151 communicates with the interior 126 of the housing 121 via the opened door 156, and the semiconductor wafer 5 is sent into the discharging chamber 151 via the opened door 156. After the semiconductor wafer 5 is delivered into the discharging chamber 151, the semiconductor wafer 5 is held by the wafer stage 152, and the semiconductor wafer 5 is moved by the wafer stage 152 to a suitable position for performing the discharging process.

It is should be noted that since the discharging chamber 151 is disposed in the housing 121, the semiconductor wafer 5 passes through an ambient controlled environment in the housing 121 before the semiconductor wafer 5 is transferred into the discharging chamber 151.

The discharging process continues with operation 52 in which the discharging chamber 151 is enclosed. In some embodiments, the door 156 allowing the semiconductor wafer 5 to enter the interior 150 of the discharging chamber 151 is closed when the robotic arm 122 leaves the discharging chamber 151. After the door 156 is closed, an air environment held in the discharging chamber 151 is secluded from an air environment held in the interior 126 of the housing 121. Thus, the air flow produced by the fan filter assembly 123 of the interface module 12 is not allowed to enter the interior 150 of the discharging chamber 151. As a result, the particle or contamination in the interior 126 of the housing 121 is not allowed to enter the enclosed discharging chamber 151.

The discharging process continues with operation 53 in which at least one characteristic of the surface of the semiconductor wafer 5 in the enclosed discharging chamber 151 is detected. In some embodiments, the surface charge of the semiconductor wafer 5 is detected by the charge detection unit 153 disposed in the discharging chamber 151. In some embodiments, the charge detection unit 153 detects a selected single point of the semiconductor wafer 5. In some embodiments, the charge detection unit 153 detects the surface charge by scanning a selected region of the surface of the semiconductor wafer 5. The detected data produced by the charge detection unit 153 is then transmitted to the measurement control unit 161 and analyzed by the measurement control unit 161.

The discharging process continues with operation 54 in which charged particles are discharged over the semiconductor wafer 5. In some embodiments, the measurement result produced by the measurement control unit 161 is transmitted to the discharge control unit 162. Afterwards, the discharge control unit 162 outputs a signal to control the recipe of the charged particle (e.g. amount of the charged particles, or electrical property of the charged particles) produced by the ion source unit 154 according to the measurement result.

In some embodiments, during particle discharging, the ion source unit 154 is controlled to move so as to discharge the charged particles over the semiconductor wafer 5 in a scanning manner. In some embodiments, the ion source unit 154 is fixed, the charged particles are showered over a region of the surface of semiconductor wafer 5 which aligns with the ion source unit 154. In some embodiments, charged particles are supplied from a number of ion source units 154 positioned in the discharging chamber 151, and each ion source unit 154 directs ion beam along a path to impinge a corresponding area of the semiconductor wafer 5.

In some embodiments, since the discharging chamber 151 is secluded from the interior 126 of the housing 120, particles and contamination in the interior 126 of the housing 121 will not enter the discharging chamber 151. As a result, particle issue due to charged particles attracting particles and contamination in the ambient or in the interior 126 of the housing 121 is sufficiently prevented.

The discharging process continues with operation 55 in which the semiconductor wafer 5 is removed from the discharging chamber 151. In some embodiments, after the ion source unit 154 stops operating, one of the two doors, such as door 157, is opened. The interior 150 of the discharging chamber 151 communicates with the interior 126 of the housing 121 via the opened door 157, and the semiconductor wafer 5 is removed from the discharging chamber 151 via the opened door 157 by the robotic arm 122.

In some embodiments, after the removal of the semiconductor wafer 5, the door 157 is closed so as to seclude the discharging chamber 151 from the interior 126 of the housing 121. Afterwards, a gas purge is performed. In some embodiments, gas is supplied into the discharging chamber 151 via the gas inlet 1551, and gas in the discharging chamber 151 is removed via the gas outlet 1552. The gas supplied into the discharging chamber 151 may include nitrogen (N2), hydrogen (H2), helium (He), or argon (Ar), and/or a combination thereof. In some embodiments, the gas purge is stopped before the next semiconductor wafer 5 is transferred into the discharging chamber 151.

In some embodiments, after the discharging process, the method 50 continues to operation 56 in which the semiconductor wafer 5 is processed in a processing module, such as first processing module 13. In some embodiments, since the semiconductor wafer 5 has been processed the discharging process, arcing, Galvanic corrosion, or pitting due to existing charge on the semiconductor wafer 5 or process fluids (e.g. chemical, DIW, and plasma etc.) is prevented.

In some embodiments, the first processing module 13 performs a dry etching process over the semiconductor wafer 5. When the semiconductor wafer 5 is loaded in the first processing module 13, the semiconductor wafer 5 is held by a wafer platform (not shown in figures). An electrical bias is then applied to the wafer platform in order to control the plasma deposition process. Since the surface charge of the semiconductor wafer is neutralized in the discharging process, damage to one or more dies on the semiconductor wafer 5 is prevented as the plasma is produced.

As shown in FIG. 5, in some embodiments, the semiconductor wafer 5 is moved in and out the discharging chamber 151 by the same robotic arm 122 of the interface module 12. In addition, the semiconductor wafer 5 is sent into the first processing module 13 or the load lock module 14 by the robotic arm 122. After the process in the first processing module 13 is finished, the semiconductor wafer 5 is transferred by the same robotic arm 122 to load in the carrier 40. However, it should be appreciated that many variations and modifications can be made to embodiments of the disclosure.

For example, as shown in FIG. 6, before the discharging process, the semiconductor wafer 5 is moved in the discharging chamber 151 by the robotic arm 122 of the interface module 12. After the discharging process, the semiconductor wafer 5 is moved out the discharging chamber 151 by another robotic arm 122' of the interface module 12. Afterwards, the semiconductor wafer 5 is sent into the first processing module 13 or the load lock module 14 by the robotic arm 122'. After the process in the first processing module 13 is finished, the semiconductor wafer 5 is transferred by the same robotic arm 122 or 122' to load in the carrier 40.

Figure 7:
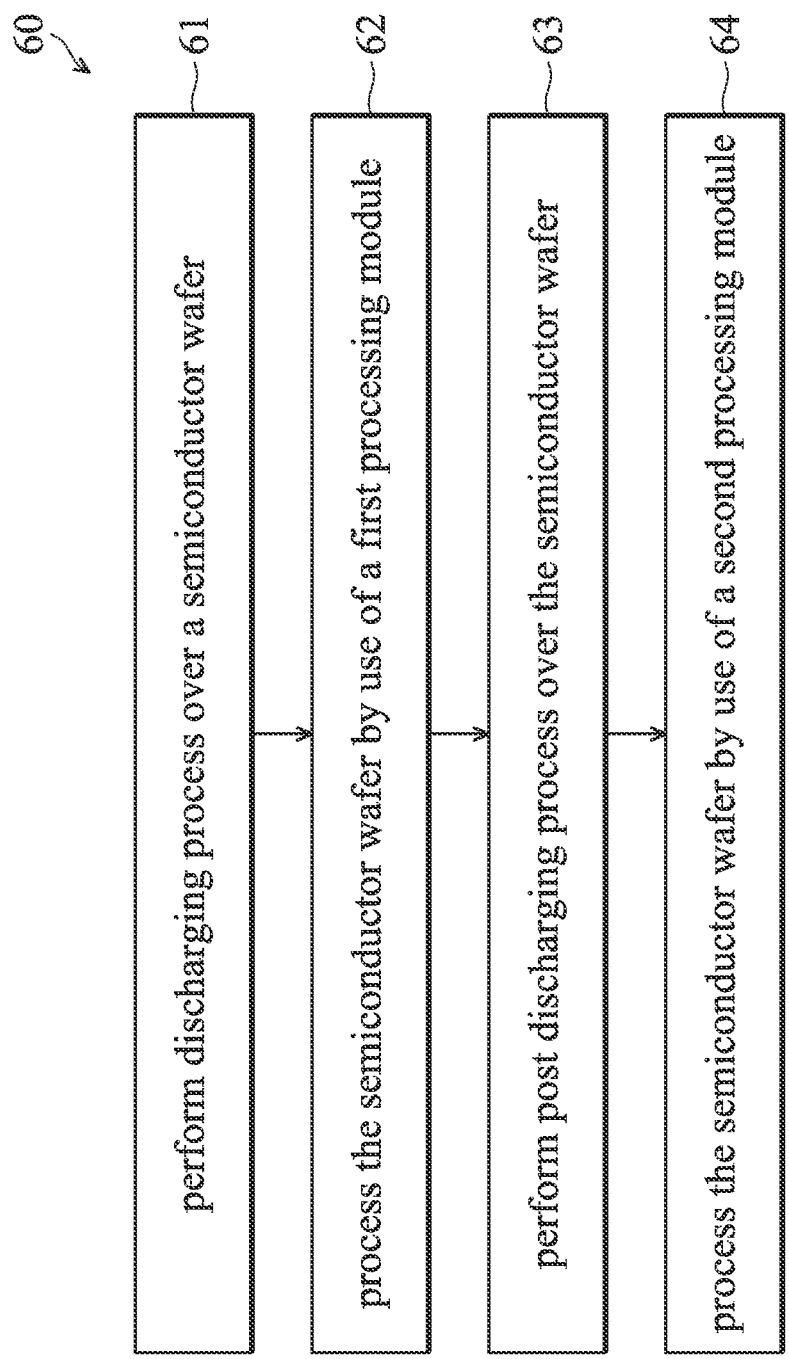
FIG. 7 shows a flow chart of methods for processing a semiconductor wafer with a post discharging process, in accordance with some embodiments.

FIG. 7 is a flow chart illustrating a method 60 for processing a semiconductor wafer by the system 1, in accordance with some embodiments. For illustration, the flow chart will be described along with the schematic views shown in FIGS. 1-3. Some of the stages described can be replaced or eliminated for different embodiments. Additional features can be added in the semiconductor device structure. Some of the features described below can be replaced or eliminated for different embodiments.

The method 60 begins with operation 61 in which a discharging process is performed over the semiconductor wafer 5. In some embodiments, the discharging process is performed in the discharging chamber 151. The discharging process may include operations 51-55 as described in FIG. 5. Afterwards, the method 60 continues with operation 62 in which a first process is performed over the semiconductor wafer 5 by the first processing module 13.

The method 60 continues with operation 63 in which a post discharging process is performed over the semiconductor wafer 5. In some embodiments, after the semiconductor wafer 5 is removed from the first processing module 13, the semiconductor wafer 5 is transferred into the discharging module 15 for the post discharging process. The post discharging process may include operations 51-55 as described in FIG. 5. In some embodiments, the semiconductor wafer 5 is sent into the discharging chamber 151 via the door 157 and moved out the discharging chamber via the door 156. However, it should be appreciated that many variations and modifications can be made to embodiments of the disclosure.

The method 60 continues with operation 64 in which a second process is performed over the semiconductor wafer 5 by the second processing module 23. In some embodiments, the semiconductor wafer 5 which has been processed the post discharging process is transferred into the carrier 40. Afterwards, the carrier 40 is conveyed to the second processing apparatus 20 by the transporting apparatus 30. When the carrier 40 is positioned on the load port 11 of the second processing apparatus 20, the door of the interface module 12 is opened. Afterwards, the semiconductor wafer 5 is directly transferred into the load lock module 14 and processed by the second processing module 23.

In some embodiments, since the semiconductor wafer 5 has been processed the post discharging process, arcing, Galvanic corrosion, or pitting due to existing charge on the semiconductor wafer 5 or process fluids (e.g. chemical, DIW, and plasma etc.) is prevented. Therefore, the production yield of the semiconductor wafer 5 is greatly improved. In addition, because both of the discharging process and the post discharging process are performed by the discharging module 15 of the first processing apparatus, there is no need to position another discharging module 15 in the interface module 12 of the second processing apparatus 20. As a result, the manufacturing cost is reduced.

Figure 8:
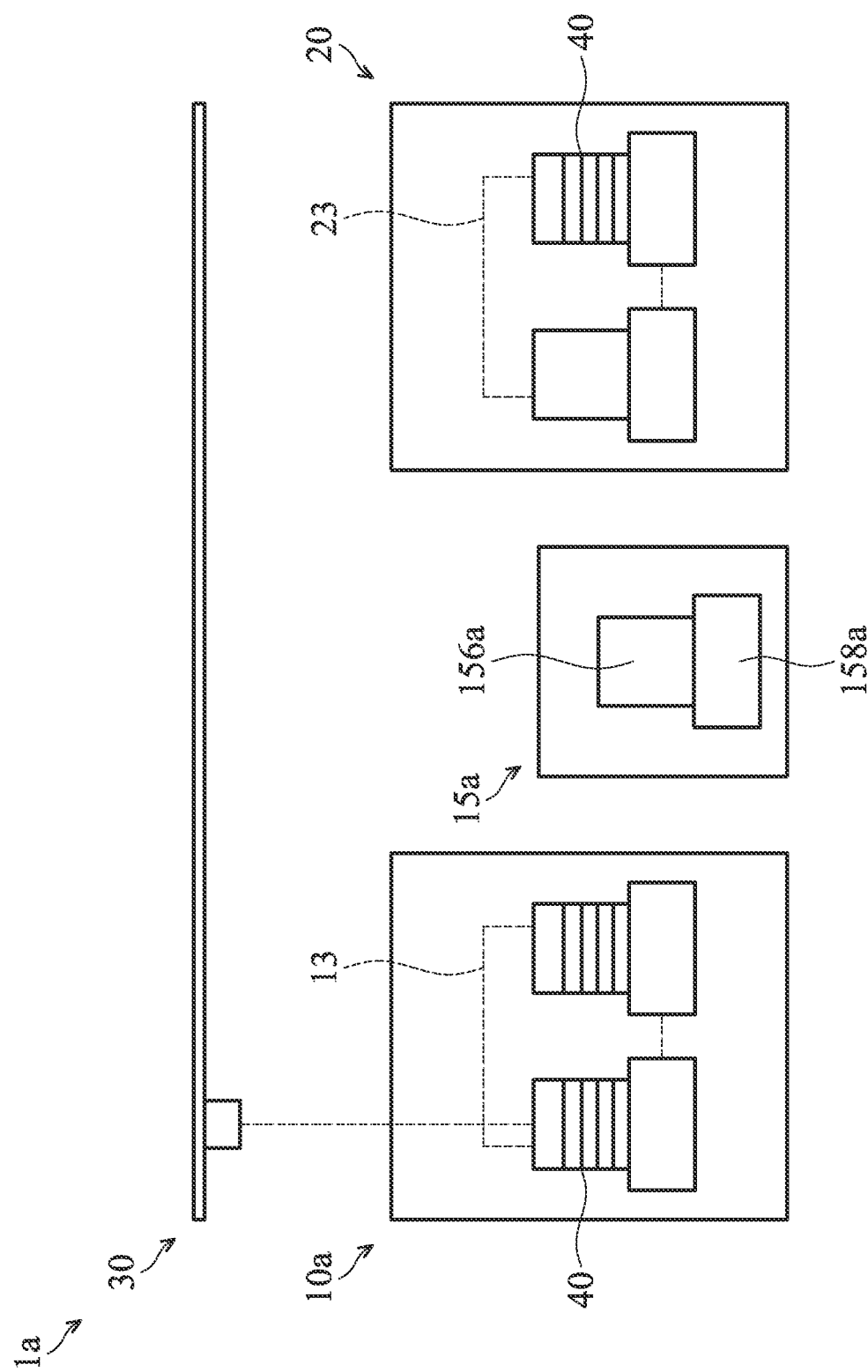
FIG. 8 is a schematic view of a system for processing a semiconductor wafer in semiconductor manufacturing process, in accordance with some embodiments.

FIG. 8 is a schematic view of a system 1a for processing a semiconductor wafer 5 in semiconductor manufacturing process, in accordance with some embodiments. In some embodiments, differences between the system 1a and the system 1 include the omission of discharging module 15 in the first processing apparatus 10a and the system 1a further including a discharging module 15a.

Figure 9:
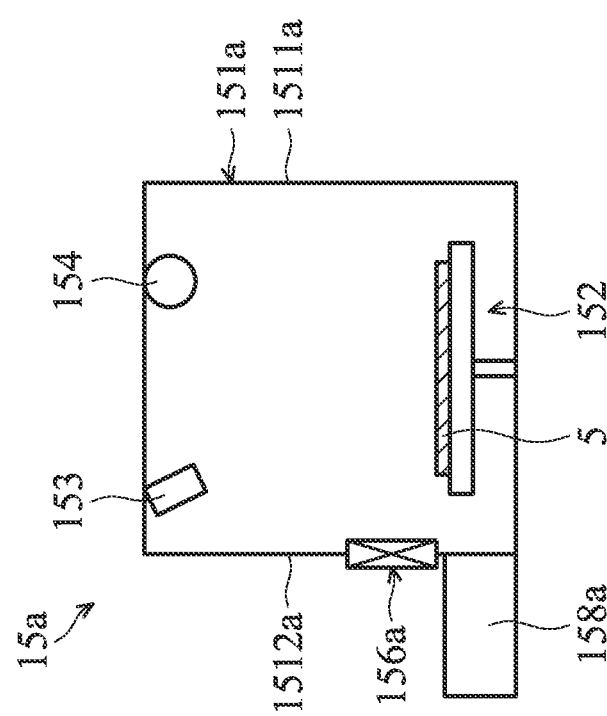
FIG. 9 shows a schematic view of partial elements of a first processing apparatus, in accordance with some embodiments.

As shown in FIG. 9, the discharging module 15a includes a discharging chamber 151a, the wafer stage 152, the charge detection unit 153, the ion source unit 154, and the gas purging unit 157, and a load port 158a. In the embodiments, similar elements which are shown in FIG. 3 are provided with the same reference numbers, and the features of similar elements are not reiterated in the interest of brevity.

In some embodiments, the discharging chamber 151a includes a door 156a and a number of side panels such as two vertical side panels 1511a and 1512a. The two vertical side panels 1511a and 1512a are arranged opposite to each other. The door 156a is positioned on the vertical side panel 1512a for enabling the delivery of the semiconductor wafer 5.

Figure 10:
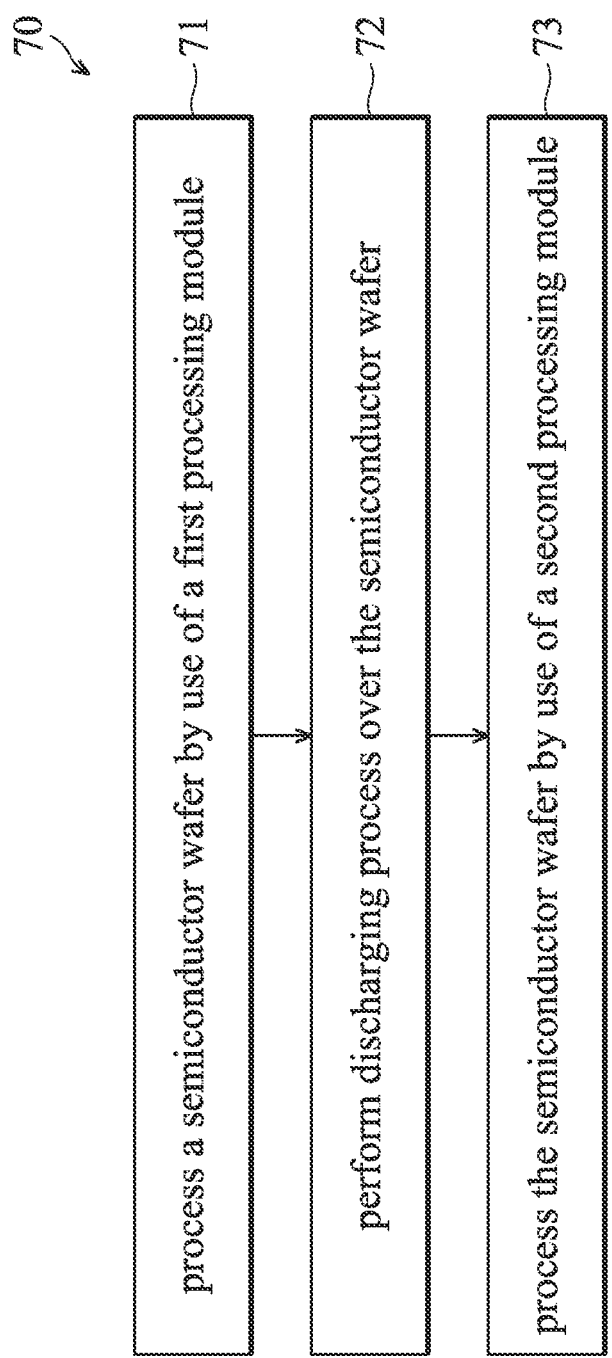
FIG. 10 shows a flow chart of methods for processing a semiconductor wafer, in accordance with some embodiments.

FIG. 10 is a flow chart illustrating a method 70 for processing a semiconductor wafer by the system 1a, in accordance with some embodiments. For illustration, the flow chart will be described along with the schematic views shown in FIG. 9. Some of the stages described can be replaced or eliminated for different embodiments. Additional features can be added in the semiconductor device structure. Some of the features described below can be replaced or eliminated for different embodiments.

The method 70 begins with operation 71 in which a first process is performed over the semiconductor wafer 5 by use of the first processing module 13.

The method 70 continues with operation 72 in which a discharging process is performed over the semiconductor wafer 5 by use of the discharging module 15a. In some embodiments, the semiconductor wafer 5 which has processed by the first processing apparatus 10a is loaded in the carrier 40, and then the carrier 40 is transferred to the load port 158a via the transporting apparatus 30. When the carrier 40 is located on the load port 158a, the door 156a is opened and the semiconductor wafer 5 is loaded into the discharging module 15a via the door 156a for discharging process. The discharging process may include operations 51-55 as described in FIG. 5.

In some embodiments, after the discharging process the semiconductor wafer 5 is moved out the discharging chamber 151a via the same door 156a as it being transferred into the discharging chamber 151a.

The method 70 continues with operation 73 in which a second process is performed over the semiconductor wafer 5 by use of the second processing module 23. In some embodiments, the first process is different from the second process. For example, the first process is a photo-lithography process, and the scone process is a dry or wet etching process. Since the semiconductor wafer 5 has been processed discharging process before the second process, arcing, Galvanic corrosion, or pitting due to existing charge on the semiconductor wafer 5 or process fluids (e.g. chemical, DIW, and plasma etc.) is prevented.

Embodiments of mechanisms for controlling surface charge of a semiconductor wafer described above use a discharging module to neutralize charge existing on a semiconductor wafer. A discharging process is performed in the discharging chamber. Since the discharging chamber is secluded from the ambient environment, the risk of contamination of the semiconductor wafer during the discharging process is reduced. Production yield of the semiconductor wafer is greatly improved. In addition, since the means for detecting the surface charge and the means for discharging charged particles are positioned in the discharging chamber, a real-time close loop control for discharge is realized. Therefore, throughput of a given process is improved. Additionally, since the supply of the charged particles is controlled according to the measurement result of the surface charge on the semiconductor wafer, an electrical property or the amount of charged particles is exactly selected. As a result, discharging efficiency is increased.

In accordance with some embodiments, a method for processing a semiconductor wafer is provided. The method includes moving the semiconductor wafer into a discharging chamber and enclosing the discharging chamber to form an enclosed discharging chamber. The method further includes detecting at least one characteristic of a surface of the semiconductor wafer in the enclosed discharging chamber. The method also discharging charged particles over the semiconductor wafer in the enclosed discharging chamber. During discharging, the supply of the charged particles is controlled according to a detected result of the at least one characteristic of the surface of the semiconductor wafer. In addition, the method includes removing the semiconductor wafer from the discharging chamber. Additionally, the method includes processing the semiconductor wafer in a processing module.

In accordance with some embodiments, a method for processing a semiconductor wafer is provided. The method includes performing a discharging process over the semiconductor wafer in a discharging chamber which is enclosed. During the discharging process, charged particles applied on the semiconductor wafer are tuned based on at least one characteristic of the surface of the semiconductor wafer The method further includes processing the semiconductor wafer by use of a first processing module after the discharging process.

In accordance with some embodiments, a system for processing a semiconductor wafer is provided. The system includes a discharging module comprising. The discharging module includes a discharging chamber, a charge detection unit, and an ion source unit. The discharging chamber includes a door for enclosing the discharging chamber. The charge detection unit is disposed in the discharging chamber and is used to detect surface charge of a semiconductor wafer in the discharging chamber. The ion source unit is disposed in the discharging chamber and is used to discharge charged particles over the semiconductor wafer in the discharging chamber. The system further includes a control module. The control module is used to control the supply of charged particles from the ion source unit according to measurement result of the surface charge of the semiconductor wafer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for processing a semiconductor wafer, comprising:
    moving the semiconductor wafer from an ambient controlled environment of an interface module into a discharging chamber positioned in the ambient controlled environment;
    enclosing the discharging chamber to produce an enclosed discharging chamber;
    detecting at least one characteristic of a surface of the semiconductor wafer in the enclosed discharging chamber;
    discharging charged particles over the semiconductor wafer in the enclosed discharging chamber based on the detection; and
    removing the semiconductor wafer from the discharging chamber and moving the removed semiconductor wafer to the ambient controlled environment of the interface module;
    wherein the discharging chamber is in fluid communication with the ambient controlled environment while the semiconductor wafer is moved to the discharging chamber and while the semiconductor wafer is removed from the discharging chamber.

2. The method as claimed in claim 1, wherein the detecting at least one characteristic of a surface of the semiconductor wafer is performed at a single point of the surface of the semiconductor wafer.

3. The method as claimed in claim 1, wherein the detecting at least one characteristic of a surface of the semiconductor wafer is performed by scanning a region of the surface of the semiconductor wafer.

4. The method as claimed in claim 1, further comprising purging gas over the discharging chamber after the semiconductor wafer is removed from the discharging chamber or before another semiconductor wafer is transferred into the discharging chamber.

5. The method as claimed in claim 1, wherein the semiconductor wafer is transferred from a carrier, which is configured to contain a plurality of semiconductor wafers, via the ambient controlled environment and the discharging chamber for a discharging process and is sent to the processing module.

6. The method as claimed in claim 1, wherein the semiconductor wafer is transferred from the processing module via the ambient controlled environment and the discharging chamber for a discharging process and is sent to a carrier which is configured to contain a plurality of semiconductor wafers.

7. The method as claimed in claim 1, wherein an air environment held in the enclosed discharging chamber is secluded from an outside of the enclosed discharging chamber.

8. The method as claimed in claim 4, wherein the purging gas over the discharging chamber is performed when the discharging chamber is sealed.

9. The method as claimed in claim 1, wherein the semiconductor wafer is transferred by a robotic arm which is disposed in the ambient controlled environment of the interface module.

10. A method for processing a semiconductor wafer, comprising:
    moving the semiconductor wafer into a discharging chamber from an ambient controlled environment of an interface module;
    enclosing the discharging chamber to produce an enclosed discharging chamber;
    detecting at least one characteristic of a surface of the semiconductor wafer in the enclosed discharging chamber;
    discharging charged particles over the semiconductor wafer in the enclosed discharging chamber based on the detection;
    removing the semiconductor wafer from the discharging chamber and moving the removed semiconductor wafer to the ambient controlled environment of the interface module; and
    wherein the semiconductor wafer is transferred from a first region of the ambient controlled environment into the discharging chamber via a first door of the discharging chamber and is removed from the discharging chamber to a second region of the ambient controlled environment via a second door of the discharging chamber, wherein the second door is different from the first door, and the first region fluidly communicates with the second region.

11. A method for processing a semiconductor wafer, comprising:

moving the semiconductor wafer from an ambient controlled environment of an interface module into a discharging chamber positioned in the ambient controlled environment;

performing a discharging process on the semiconductor wafer in the discharging chamber which is enclosed, wherein during the discharging process, charged particles applied on the semiconductor wafer are tuned based on at least one characteristic of a surface of the semiconductor wafer;

removing the semiconductor wafer from the discharging chamber and moving the semiconductor wafer to the ambient controlled environment of the interface module; and processing the semiconductor wafer in a first processing module after the discharging process;

wherein the discharging chamber is in fluid communication with the ambient controlled environment while the semiconductor wafer is moved to the discharging chamber and while the semiconductor wafer is removed from the discharging chamber.

12. The method as claimed in claim 11, further comprising:

performing a post discharging process in the discharging chamber or another discharging chamber which is enclosed after the semiconductor wafer has been processed by the first processing module; and processing the semiconductor wafer which has been processed in the post discharging process by use of a second processing module.

13. The method as claimed in claim 12, further comprising:

moving the semiconductor wafer which has been processed in the post discharging process to a carrier; and transferring the semiconductor wafer to the second processing module via the carrier.

14. The method as claimed in claim 11, further comprising:

moving the semiconductor wafer from a carrier and passing through the ambient controlled environment to the discharging chamber;

enclosing the discharging chamber for performing the discharging process;

moving the semiconductor wafer from the discharging module and passing through the ambient controlled environment to the carrier or another carrier; and transferring the semiconductor wafer together with the carrier or the other carrier which has been processed in the discharging process to the first processing module.

15. The method as claimed in claim 11, further comprising performing a gas purge during a time interval between operations of performing the discharging process over two different semiconductor wafers.

16. The method as claimed in claim 11, wherein the charged particles are tuned based on at least one characteristic of a single point on the surface of the semiconductor wafer.

17. The method as claimed in claim 11, wherein the charged particles are tuned based on at least one characteristic of a region on the surface of the semiconductor wafer.

18. The method as claimed in claim 11, wherein when the discharging chamber is enclosed, an air environment held in the discharging chamber is secluded from an outside of the discharging chamber.

19. The method as claimed in claim 15, wherein the gas purge is performed when the discharging chamber is sealed.

20. The method as claimed in claim 11, wherein the semiconductor wafer is transferred by a robotic arm which is disposed in the ambient controlled environment of the interface module.

21. The method as claimed in claim 11, wherein the semiconductor wafer is transferred from a first region of the ambient controlled environment into the discharging chamber via a first door of the discharging chamber and is removed from the discharging chamber to a second region of the ambient controlled environment via a second door of the discharging chamber, wherein the second door is different from the first door, and the first region fluidly communicates with the second region.

* * * * *